United States Patent
Gang et al.

(10) Patent No.: US 10,196,152 B2
(45) Date of Patent: Feb. 5, 2019

(54) SENSOR DATA PROCESSING FOR CONDITION MONITORING SYSTEMS

(71) Applicant: Simmonds Precision Products, Inc., Vergennes, VT (US)

(72) Inventors: Travis Gang, Burlington, VT (US); Peter Carini, Underhill, VT (US); Richard Joseph Sopko, South Burlington, VT (US)

(73) Assignee: Simmonds Precision Products, Inc., Vergennes, VT (US)

( * ) Notice: Subject to any disclaimer, the term of this patent is extended or adjusted under 35 U.S.C. 154(b) by 308 days.

(21) Appl. No.: 15/083,438

(22) Filed: Mar. 29, 2016

(65) Prior Publication Data
US 2017/0283084 A1  Oct. 5, 2017

(51) Int. Cl.
| | |
|---|---|
| B64D 45/00 | (2006.01) |
| G07C 5/00 | (2006.01) |
| G01P 15/00 | (2006.01) |
| G01P 15/16 | (2013.01) |
| G01P 3/44 | (2006.01) |
| G01P 3/00 | (2006.01) |
| H03M 1/12 | (2006.01) |

(52) U.S. Cl.
CPC ............ *B64D 45/00* (2013.01); *G01P 3/00* (2013.01); *G01P 3/44* (2013.01); *G01P 15/00* (2013.01); *G01P 15/165* (2013.01); *G07C 5/00* (2013.01); *G07C 5/002* (2013.01); *H03M 1/12* (2013.01)

(58) Field of Classification Search
None
See application file for complete search history.

(56) References Cited

U.S. PATENT DOCUMENTS

| | | |
|---|---|---|
| 5,005,142 A | 4/1991 | Lipchak et al. |
| 5,386,689 A | 2/1995 | Bozich et al. |
| 5,445,028 A | 8/1995 | Bianchi et al. |
| 6,717,541 B1 | 4/2004 | Carter-Lewis et al. |
| 7,005,981 B1 | 2/2006 | Wade |
| 7,676,342 B2 | 3/2010 | Vreede et al. |
| 7,769,507 B2 | 8/2010 | Volponi et al. |
| 7,793,559 B2 | 9/2010 | Susfalk et al. |
| 8,144,005 B2 | 3/2012 | Hu et al. |
| 8,352,216 B2 | 1/2013 | Subbu et al. |
| 8,539,369 B2 | 9/2013 | Haupt et al. |
| 8,560,160 B2 | 10/2013 | Holzer |

(Continued)

OTHER PUBLICATIONS

Bechhoefer, E., Kinglsey, M., "A Review of Time Synchronous Average Algorithms", Annual Conference of Prognostics and Health Management Society, 2009.*

(Continued)

*Primary Examiner* — Joseph Schoenholtz
(74) *Attorney, Agent, or Firm* — Kinney & Lange, P.A.

(57) ABSTRACT

A sensor system and method includes first and second sensing elements, digital sensors, a host computer and a digital bus. The first sensing element is configured to collect first sensor data and the second sensing element is configured to collect second sensor data. The digital sensor includes a controller that is configured to receive the first and second sensor data and process the first sensor data together with the second sensor data to generate processed data. The host computer is configured to receive the processed data from the digital sensor over the digital bus.

19 Claims, 1 Drawing Sheet

(56) References Cited

U.S. PATENT DOCUMENTS

| | | |
|---|---|---|
| 8,648,734 B2 | 2/2014 | Harnett |
| 8,682,509 B2 | 3/2014 | Goodrich et al. |
| 9,090,339 B2 | 7/2015 | Arms et al. |
| 2003/0163298 A1* | 8/2003 | Odom .................. G06F 9/4411 703/21 |
| 2006/0020774 A1* | 1/2006 | Ramos ................ G06F 13/4217 712/226 |
| 2012/0101776 A1* | 4/2012 | Brower .................. B64D 43/00 702/183 |
| 2013/0211737 A1 | 8/2013 | Batcheller et al. |
| 2014/0023087 A1 | 1/2014 | Czompo |
| 2016/0026173 A1* | 1/2016 | Willis ................ G05B 19/4065 700/175 |
| 2017/0067860 A1* | 3/2017 | Grabill .................... G01P 3/481 |

OTHER PUBLICATIONS

Extended European Search Report for EP Application No. 17159247.0, dated Jul. 3, 2017, 12 pages.

\* cited by examiner

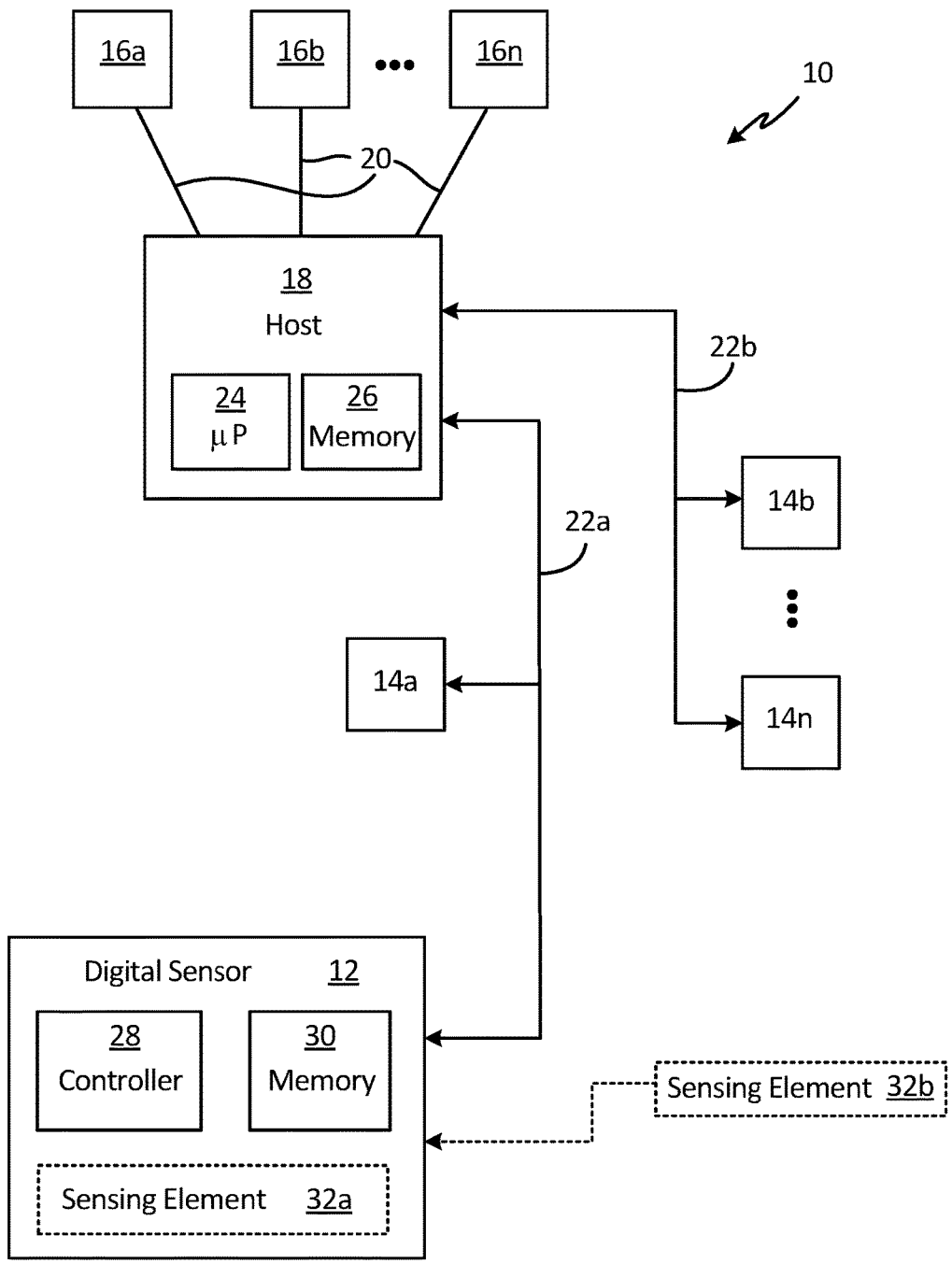

SENSOR DATA PROCESSING FOR CONDITION MONITORING SYSTEMS

BACKGROUND

The present application relates generally to sensors, and in particular to a system and method for processing of digital sensor data.

Condition monitoring systems, such as those implemented on aircraft, may include data acquisition, data manipulation, and state detection. Data acquisition includes the input of digitized data to the condition monitoring system. Data manipulation includes the transformation and algorithmic processing of the digitized data in order to extract features of the monitored system. These features may be generated from the input of a single sensor or could be dependent on the interaction of multiple sensors. The condition monitoring system compares the features extracted through data manipulation against expected values, enumerating the relative health of that feature. Prior art condition monitoring systems include analog and digital sensors connected to a central host computer. The central host computer performs digitization of the analog data and all data manipulation. This requires heavy processing by the host computer, and high bandwidth between the host and the digital sensors. It is desirable to limit the processing load on the host computer without reducing the functionality of the monitoring system.

SUMMARY

A method of processing sensor data includes obtaining, using a first sensing element, first sensor data; obtaining, using a second sensing element, second sensor data; obtaining, by a first digital sensor, the first sensor data; obtaining, by the first digital sensor via a digital bus, received sensor data corresponding to the second sensor data; processing, by a controller of the first digital sensor, the first sensor data and the received sensor data to generate processed data; and providing the processed data to a host computer.

A sensor system includes a first sensing element, a second sensing element, a host computer, a digital bus and a digital sensor. The first sensing element is configured to collect first sensor data and the second sensing element is configured to collect second sensor data. The digital sensor includes a controller configured to obtain the first sensor data and received sensor data via the digital bus. The received sensor data corresponds to the second sensor data and the controller is configured to process the first sensor data and the received sensor data to generate processed data. The digital sensor is configured to provide the processed data to the host computer via the digital bus.

BRIEF DESCRIPTION OF THE DRAWINGS

FIG. 1 is a block diagram illustrating a sensor system that includes a digital sensor that provides distributed processing for the sensor system.

DETAILED DESCRIPTION

A sensor system is disclosed herein that includes digital sensors that perform data processing based upon sensed data of the digital sensor and/or sensed data from separate analog and/or digital sensors. The system includes multiple sensing sources connected to provide sensed data to a digital sensor. The sensing sources may be local and/or remote sensing elements connected directly to the digital sensor, or may be separate analog and/or digital sensors. For separate analog and/or digital sensors, the sensed data may be compressed by a host computer or the separate digital sensor itself prior to provision of the sensed data to the digital sensor. The digital sensor utilizes the sensed data from the multiple sensing sources to perform data processing on the sensed data. The digital sensor may provide the processed data to the host computer.

FIG. 1 is a block diagram illustrating sensor system 10 that includes digital sensors 12 and 14a-14n, analog sensors 16a-16n and host 18. Analog sensors 16a-16n are connected to host 18 over analog connections 20 which may be, for example, copper wires or other cables capable of transmitting analog signals to host 18. Digital sensors 12 and 14a are connected to digital bus 22a and digital sensors 14b-14n are connected to digital bus 22b. Host 18 includes microprocessor 24 and memory 26. Digital sensor 12 includes controller 28, memory 30 and sensing elements 32a and/or 32b.

Digital sensors 12 and 14a-14n are any sensors capable of obtaining data regarding an environment and digitizing the data at the sensor. Digital sensor 12 includes sensing elements 32a and/or 32b, which may be any type of transducer, for example, that produces an analog electrical output indicative of a characteristic of the environment. Sensing element 32b may be located at any physical location apart from digital sensor 12, while sensing 32a may be integral to digital sensor 12. Digital sensor 12 may include only sensing element 32a, only sensing element 32b, or both sensing elements 32a and 32b. In other embodiments, digital sensor 12 may include multiple local and/or external sensing elements 32a and 32b.

Analog sensors 16a-16n are any sensors that obtain data regarding an environment and provide the analog data as output. Digital sensors 12 and 14a-14n, and analog sensors 16a-16n may be any sensors such as, for example, accelerometers, tachometers, indexers, optical trackers, temperature, pressure, vibration, shock and/or strain sensors.

Data processing may be distributed to digital sensor 12 to reduce the overall amount of data transmitted to, stored by, and processed by host 18. In prior art systems, raw analog and/or digital data was provided to host 18 from both digital sensors 12 and 14a-14n and analog sensors 16a-16n. Host 18 converted the analog data from sensors 16a-16n into digital data and stored the data from both digital sensors 12 and 14a-14n, and analog sensors 16a-16n in memory 26. Microprocessor 24 then processed the data stored in memory 26 to extract desired features of the monitored systems based on the stored raw sensor data. Because some of these sensors output very high amounts of raw data, storing and processing the data from all sensors at host 18 required heavy processing and data storage by host 18.

Digital sensor 12 may be configured to receive data from other separate sensors (e.g., digital sensors 14a-14n and/or analog sensors 16a-16n) and/or from multiple sensing elements 32a and 32b, and may be configured to process the received data. For example, digital sensor 12 may be an accelerometer that collects and digitizes raw acceleration data and one of analog sensors 16a-16n may be a tachometer that provides one or more pulses indicative of revolutions of a shaft. Features are often determined utilizing both accelerometer data and data from other sensors, for example, such as the tachometer data. Therefore, the tachometer data may be provided to the accelerometer (i.e., digital sensor 12) such that the accelerometer can process the raw acceleration data in conjunction with the tachometer data. In another embodiment, sensing element 32a may provide raw acceleration data while sensing element 32b may provide raw tachometer data, for example. The raw acceleration and tachometer data may be collected and processed by digital sensor 12 prior to provision of the data to host 18.

In an embodiment, the tachometer may generate many pulses for each revolution of a monitored shaft. Digital sensor 12 may process the acceleration data together with the tachometer pulses to perform a Time Synchronous Average (TSA) to extract periodic waveforms from noisy data. Calculation of TSA allows data collected from multiple revolutions of rotating machinery to be combined, separating the vibration signatures of components associated with the monitored shaft from other noise sources not synchronous with the shaft. This way, averaged acceleration data for one revolution of the shaft may be provided to host 18 in place of raw acceleration and/or tachometer data over several revolutions, greatly reducing the amount of data required to be transmitted to host 18 over digital bus 22a.

Additionally, in an embodiment, further processing may be performed by digital sensor 12 beyond determination of the TSA. Having the TSA performed locally at digital sensor 12 allows further data analysis to be performed by digital sensor 12. Using the determined TSA, digital sensor 12 may be configured to extract condition indicators (CI)'s representative of the health of the monitored components (e.g., the rotating machinery). These CI's may be provided to host 18 in place of the TSA data, which may further reduce the amount of data required to be transmitted to host 18 over digital bus 22a.

Host 18 may be any system that includes microprocessor 24 and memory 26 such as, for example, an aircraft avionics system. Microprocessor 24 may be any device or circuit capable of processing data through hardware and/or software. Memory 26 may be any device capable of storing data electronically and may be any volatile or non-volatile memory device. Host 18 is connected to analog sensors 16a-16n over analog connections 20. Analog sensors 16a-16n may stream analog data continuously to host 18, or host 18 may poll analog sensors 16a-16n at regular intervals. For example, if an analog tachometer is connected to host 18, the tachometer may provide one or more analog pulses to host 18 for each revolution of a shaft. Host 18 may digitize this data by providing a logic 0 when no pulse is received and a logic 1 when a pulse is received.

Host 18 may also be connected to digital buses 22a and 22b to receive digital sensor data from sensors 12 and 14a-14n. Digital buses 22a and 22b may be RS-485 buses, for example, or any other deterministic data buses. The data may be provided serially, for example, to host 18, or may be sent in data packets of any desirable size. Similar to analog sensors 16a-16n, this digital data may be streamed continuously, or may be provided only when host 18 requests the data. In other embodiments, buses 22a and 22b may be optical buses configured to transmit both digital data and power over one or more fiber optic cables, for example.

To facilitate distributed processing by digital sensor 12, host 18 may compress data received from other sensors 14a-14n and 16a-16n, separate to sensor 12, prior to sending the data to digital sensor 12. By compressing the data, the amount of data transmitted on digital bus 22a as well as the total data stored by digital sensor 12 may be reduced. In one embodiment, data may be obtained by host 18 from a digital or analog pressure and/or temperature sensor. Data from sensors such as pressure and/or temperature sensors may be compressed due to the slow changing nature of the data. For example, to limit the amount of data transfer, data could be provided to digital sensor 12 from host 18 only when there is a change in the sensor data obtained by host 18 that is greater than a threshold amount. If analog sensor 16a is a temperature sensor, for example, host 18 may digitize the data from analog sensor 16a and provide an initial data value to sensor 12. Following the initial data value, host 18 may only provide additional sensor data from analog sensor 16a to digital sensor 12 when the output of analog sensor 16a is indicative of a change in temperature of one degree or more. While described for pressure and/or temperature sensor data, this type of data compression may be utilized for any sensor that provides data that changes slowly over time.

Another type of sensor data that is well suited for compression and transmission to digital sensor 12 is data that is indicative of regularly occurring pulses or spikes in value as a function of time. For example, analog sensor 16b may be a tachometer that provides one or more pulses for each revolution of a shaft, such as the shaft of a gas turbine engine. Because tachometer data is so often utilized to process features regarding revolving machinery, it is desirable to compress and provide tachometer data to various digital sensors 12 and 14a-14n.

Various types of compression may be utilized for tachometer or other pulse data. Digital tachometer data (which may be from a digital tachometer, or converted from an analog tachometer by host 18) may be of the form of a logic 1 at a set point on the rising edge of a pulse, and a logic 0 otherwise. A first type of compression may include providing the time from initial acquisition, as opposed to each individual sample. For example, if 26 samples are collected, and pulses occur at the $2^{nd}$, $14^{th}$ and $26^{th}$ samples, host 18 could send three five bit values (indicative of the values 2, 14 and 26) resulting in 15 bits of data transmitted, as opposed to all 26 bits.

In a similar manner, double delta compression may be utilized on the tachometer data prior to transmission to digital sensor 12. Equations [1] and [2] below illustrate delta time and double delta compression, respectively:

$$D1_i = x_1 - x_{x-1} \quad [1]$$

$$D2_j = D1_j - D1_{j-1} \quad [2]$$

Where:
xi=current tachometer pulse time
xi−1=previous tachometer time

Using this scheme, the first two pulse times may be provided to sensor 12 from host 18, and all following data may be transmitted as double delta times. Digital sensor 12, knowing the data is in double delta format, may easily decompress the data to obtain the actual pulse times of the tachometer data. If tachometer pulse times are relatively consistent, the double delta time may be a small value allowing fewer bits to represent each double delta time, which further reduces the amount of data transmitted on digital bus 22a. For example, if the range of double delta times is under 8 samples, each pulse may be represented by 3 bits of data, as opposed to the 5 bits for the above example of direct temporal representation. Double delta compression may be even further compressed because, over time, certain double delta values may be more common than others. Knowing which double delta values are the most common, a truncated binary representation may be implemented for the double delta compression, with the lowest number of bits representing the most probable double delta values.

While described above for temperature/pressure sensors and tachometers, any form of data compression may be used by host 18 for any type of sensor data to reduce the amount of data transmitted on digital buses 22a and 22b. Further, if the data to be compressed is received from one of digital sensors 14a-14n, the digital sensor 14a-14n that is providing the data may perform the compression itself. For example, digital sensors 14a-14n may include local and/or remote sensing elements. The data sensed using the local and/or remote sensing elements may be compressed by the respective digital sensor 14a-14n. After completing the compression locally at sensor 14a-14n, the data may be provided to digital sensor 12 directly over digital bus 22a, or to host 18. For example, a sensor 14b-14n may compress its sensed data, provide the compressed data to host 18 on digital bus 22b, and host 18 may forward the compressed data to digital sensor 12 on digital bus 22a and/or utilize the compressed data for its own data processing. If the respective digital sensor 14a-14n is on the same digital bus 22a (i.e., sensor 14a) as digital sensor 12, sensor 14a may compress its sensed data and provide the compressed data directly to sensor 12 over digital bus 22a (and may also provide the compressed data to host 18).

Once digital sensor 12 has received data from multiple sensing sources, digital sensor 12 may perform processing on the received data to extract features of the monitored system. The data may be received from host 18 (e.g., from an analog sensor 16 or digital sensor 14a-14n), directly from another digital sensor on digital bus 22a, or from multiple sensing elements 32a and 32b connected directly to digital sensor 12. The received data may be stored in memory 30, which may be any volatile or non-volatile memory. Controller 28 of digital sensor 12 may be any electronic circuit capable of processing data such as a field-programmable gate array (FPGA), for example, or any other digital logic circuit. In an embodiment, controller 28 may be an FPGA configured to perform data processing for digital sensor 12 completely in hardware. In other embodiments, controller 28 may be configured to utilize hardware and/or software to perform data processing for digital sensor 12.

Controller 28 may process the received data to determine features of the monitored system. For example, if the received data from the multiple sensing sources includes tachometer data and acceleration data, controller 28 may calculate the TSA acceleration for a revolution of a shaft. Because this feature only requires the values for one revolution of the shaft, the amount of data to provide to host 18 from digital sensor 12 is greatly reduced. Digital sensor 12 may also provide further processing, for example, to extract condition indicators (CI)'s indicative of the health of the monitored components. The CI's may also be provided to host 18 along with, or in place of, the TSA acceleration data. Therefore, the processing load of host 18, as well as the amount of data host 18 is required to store, is reduced.

In some applications, the time synchronization of data from multiple sensing sources may need to be highly accurate. Digital sensors 12 and 14a-14n and host 18 may all be controlled by a master clock, or each may contain an individual clock, for example. If a master clock is utilized, host 18 and/or sensors 12 and 14a-14n may account for transmission time and latency for the master clock signal to each individual sensor 12 and 14a-14n, which would account for any synchronization issues using any compensation method, for example, such as delay compensation.

If each digital sensor 12 and 14a-14n, and host 18, includes an individual clock, host 18 or the digital sensor 14a-14n providing the compressed data, along with digital sensor 12, could be configured to perform an acquisition at a specified time. For example, microprocessor 24 may provide a universal start command to indicate that the separate sensor (e.g., digital sensors 14a-14n and/or analog sensors 16a-16n) and digital sensor 12 should begin data acquisition. Where highly accurate synchronization may be required, the difference between a time when the microprocessor 24 sends the start command and a time when the separate sensor begins an acquisition could be compared to the difference between a time when microprocessor 24 sends the start command and a time when digital sensor 12 began the acquisition. The difference between the two time delays could then be accounted for relative to the respective individual clock times of the separate sensor and digital sensor 12.

While described above as providing separate sensor data to digital sensor 12, it may be desirable that host 18 communicate the separate sensor data to multiple digital sensors 12 and 14a-14n on the same digital bus 22a or 22b. If the data transfer is time sensitive (so as to occur during an ongoing acquisition, for example) the host may need to transfer data to multiple digital sensors 12 and 14a-14n simultaneously. In an embodiment where digital bus 22a is a master/slave bus, for example, where cross talking of sensors 12 and 14a-14n is a concern, sending data to multiple sensors 12 and 14a-14n simultaneously would not easily allow for each individual sensor to confirm proper receipt of data from host 18. In this case, host 18 (i.e., the master) could send data packets to all designated digital sensors 12 and 14a-14n and assign one digital sensor 12 (i.e., slave), for example, to reply as to whether the data packets were properly received. If the data packets were not properly received by the assigned digital sensor 12, host 18 may resend the data packets to all designated digital sensors 12 and 14a-14n.

In other embodiments, data from multiple separate sensors may be provided to one or more digital sensors 12 and 14a-14n from host 18. In this embodiment, the data from the separate sensors may be provided to host 18 and host 18 may control distribution of the separate sensor data to the one or more digital sensors 12 and 14a-14n using any known method of distributing data to multiple devices connected to a common bus. By compressing separate sensor data, the sensor data may be provided to, and stored by, digital sensors with reduced bandwidth and data storage which is advantageous in the design of digital sensors. This allows the digital sensors to perform data processing on the separate sensor data in conjunction with locally sensed data. By performing this data processing locally, the load on the host may be reduced, and the amount of data transmitted to the host from the digital sensor may also be reduced.

Discussion of Possible Embodiments

The following are non-exclusive descriptions of possible embodiments of the present invention.

A method of processing sensor data includes obtaining, using a first sensing element, first sensor data; obtaining, using a second sensing element, second sensor data; obtaining, by a first digital sensor, the first sensor data; obtaining, by the first digital sensor via a digital bus, received sensor data corresponding to the second sensor data; processing, by a controller of the first digital sensor, the first sensor data and the received sensor data to generate processed data; and providing the processed data to a host computer.

The method of the preceding paragraph can optionally include, additionally and/or alternatively, any one or more of the following features, configurations, operations, and/or additional components:

A further embodiment of the foregoing method, wherein the first sensing element is connected to the first digital sensor and the second sensing element is an analog sensor, and wherein obtaining, using the second sensing element, the second sensor data includes obtaining, using the analog sensor, analog data; providing the analog data to the host computer; and converting, using the host computer, the analog data into digital sensor data.

A further embodiment of any of the foregoing methods, further including compressing, using the host computer, the digital sensor data into compressed data; and providing the compressed data as the received sensor data to the first digital sensor via the digital bus.

A further embodiment of any of the foregoing methods, wherein the analog sensor is a tachometer, and wherein the first digital sensor is an accelerometer.

A further embodiment of any of the foregoing methods, wherein the first sensing element is connected to the first digital sensor and the second sensing element is connected to a second digital sensor, and wherein obtaining, using the second sensing element, the second sensor data comprises obtaining, using the second digital sensor, digital sensor data.

A further embodiment of any of the foregoing methods, further including compressing the digital sensor data into compressed data; and providing the compressed data to the first digital sensor as the received sensor data.

A further embodiment of any of the foregoing methods, wherein processing, by the controller of the first digital sensor, the first sensor data and the received sensor data to generate the processed data includes processing, by a controller of the first digital sensor, the first sensor data and the compressed data to generate the processed data.

A further embodiment of any of the foregoing methods, wherein compressing the digital sensor data includes providing, by the second digital sensor, the digital sensor data to the host; and compressing, by the host, the second digital sensor data into the compressed data.

A further embodiment of any of the foregoing methods, wherein compressing the digital sensor data includes compressing, by the second digital sensor, the digital sensor data into the compressed data.

A sensor system includes a first sensing element, a second sensing element, a host computer, a first digital bus and a first digital sensor. The first sensing element is configured to collect first sensor data and the second sensing element is configured to collect second sensor data. The first digital sensor includes a controller configured to obtain the first sensor data and received sensor data via the first digital bus. The received sensor data corresponds to the second sensor data, and the controller is configured to process the first sensor data and the received sensor data to generate processed data. The first digital sensor is configured to provide the processed data to the host computer via the first digital bus.

The sensor system of the preceding paragraph can optionally include, additionally and/or alternatively, any one or more of the following features, configurations, operations, and/or additional components:

A further embodiment of the foregoing system, wherein the first sensing element is connected to provide the first sensor data to the first digital sensor, and wherein the second sensing element is an analog sensor.

A further embodiment of any of the foregoing systems, wherein the analog sensor is connected to provide analog sensor data to the host computer, and wherein the host computer is configured to compress the analog sensor data into compressed data and provide the compressed data to the first digital sensor as the received sensor data.

A further embodiment of any of the foregoing systems, wherein the first sensing element is connected to provide the first sensor data to the first digital sensor, and wherein the second sensing element is connected to provide the second sensor data to a second digital sensor.

A further embodiment of any of the foregoing systems, wherein the second digital sensor is connected to provide the second sensor data to the host computer, and wherein the host computer is configured to compress the second sensor data into compressed data and provide the compressed data to the first digital sensor as the received sensor data.

A further embodiment of any of the foregoing systems, wherein the second digital sensor is configured to compress the second sensor data into compressed data and provide the compressed data to the first digital sensor as the received sensor data.

A further embodiment of any of the foregoing systems, wherein the second digital sensor is connected to provide the compressed data to the first digital sensor via the first digital bus.

A further embodiment of any of the foregoing systems, further including a second digital bus, wherein the second digital sensor is configured to provide the compressed data to the host computer via the second digital bus, and wherein the host computer is configured to provide the compressed data to the first digital sensor via the first digital bus.

A further embodiment of any of the foregoing systems, wherein the sensor system is an aircraft sensor system, and wherein the second sensing element is a tachometer configured to output revolution data of rotating machinery, and wherein the first sensing element is an accelerometer configured to output acceleration data.

A further embodiment of any of the foregoing systems, wherein the controller of the first digital sensor is a field-programmable gate array (FPGA) and wherein the processed data is a time synchronous average (TSA) for the rotating machinery.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of processing sensor data, the method comprising:
   obtaining, using a first sensing element of a first digital sensor, first sensor data;
   obtaining, using a second sensing element, second sensor data;
   obtaining, by the first digital sensor via a digital bus, received sensor data corresponding to the second sensor data;
   processing, by a controller of the first digital sensor, the first sensor data and the received sensor data to generate processed data; and
   providing the processed data, via the digital bus, to a host computer.

2. The method of claim 1, wherein the first sensing element is connected to the first digital sensor and the second sensing element is an analog sensor, and wherein obtaining, using the second sensing element, the second sensor data comprises:

obtaining, using the analog sensor, analog data;
providing the analog data to the host computer; and
converting, using the host computer, the analog data into digital sensor data.

3. The method of claim 2, further comprising:
compressing, using the host computer, the digital sensor data into compressed data; and
providing the compressed data as the received sensor data to the first digital sensor via the digital bus.

4. The method of claim 3, wherein the analog sensor is a tachometer, and wherein the first digital sensor is an accelerometer.

5. The method of claim 1, wherein the first sensing element is connected to the first digital sensor and the second sensing element is connected to a second digital sensor, and wherein obtaining, using the second sensing element, the second sensor data comprises obtaining, using the second digital sensor, digital sensor data.

6. The method of claim 5, further comprising:
compressing the digital sensor data into compressed data; and
providing the compressed data to the first digital sensor as the received sensor data.

7. The method of claim 6, wherein processing, by the controller of the first digital sensor, the first sensor data and the received sensor data to generate the processed data comprises:
processing, by a controller of the first digital sensor, the first sensor data and the compressed data to generate the processed data.

8. The method of claim 6, wherein compressing the digital sensor data comprises:
providing, by the second digital sensor, the digital sensor data to the host; and
compressing, by the host, the second digital sensor data into the compressed data.

9. The method of claim 6, wherein compressing the digital sensor data comprises:
compressing, by the second digital sensor, the digital sensor data into the compressed data.

10. A sensor system comprising:
a first sensing element of a first digital sensor configured to collect first sensor data;
a second sensing element configured to collect second sensor data;
a host computer; and
a first digital bus;
wherein the first digital sensor comprises a controller configured to obtain the first sensor data from the first sensing element and to obtain received sensor data via the first digital bus, wherein the received sensor data corresponds to the second sensor data, wherein the controller is configured to process the first sensor data and the received sensor data to generate processed data, and wherein the first digital sensor is configured to provide the processed data to the host computer via the first digital bus.

11. The sensor system of claim 10, wherein the first sensing element is connected to provide the first sensor data to the first digital sensor, and wherein the second sensing element is an analog sensor.

12. The sensor system of claim 11, wherein the analog sensor is connected to provide analog sensor data to the host computer, and wherein the host computer is configured to compress the analog sensor data into compressed data and provide the compressed data to the first digital sensor as the received sensor data.

13. The sensor system of claim 10, wherein the first sensing element is connected to provide the first sensor data to the first digital sensor, and wherein the second sensing element is connected to provide the second sensor data to a second digital sensor.

14. The sensor system of claim 13, wherein the second digital sensor is connected to provide the second sensor data to the host computer, and wherein the host computer is configured to compress the second sensor data into compressed data and provide the compressed data to the first digital sensor as the received sensor data.

15. The sensor system of claim 13, wherein the second digital sensor is configured to compress the second sensor data into compressed data and provide the compressed data to the first digital sensor as the received sensor data.

16. The sensor system of claim 15, wherein the second digital sensor is connected to provide the compressed data to the first digital sensor via the first digital bus.

17. The sensor system of claim 15, further comprising a second digital bus, wherein the second digital sensor is configured to provide the compressed data to the host computer via the second digital bus, and wherein the host computer is configured to provide the compressed data to the first digital sensor via the first digital bus.

18. The sensor system of claim 10, wherein the sensor system is an aircraft sensor system, and wherein the second sensing element is a tachometer configured to output revolution data of rotating machinery, and wherein the first sensing element is an accelerometer configured to output acceleration data.

19. The sensor system of claim 18, wherein the controller of the first digital sensor is a field-programmable gate array (FPGA) and wherein the processed data is a time synchronous average (TSA) for the rotating machinery.

* * * * *